(12) United States Patent
DePalma et al.

(10) Patent No.: US 11,866,816 B2
(45) Date of Patent: Jan. 9, 2024

(54) APPARATUS FOR USE IN COATING PROCESS

(71) Applicant: United Technologies Corporation, Farmington, CT (US)

(72) Inventors: Joseph A. DePalma, Feeding Hills, MA (US); Mladen F. Trubelja, Manchester, CT (US); David A. Litton, West Hartford, CT (US); Dmitri L. Novikov, Avon, CT (US); Sergei F. Burlatsky, West Hartford, CT (US)

(73) Assignee: RTX CORPORATION, Farmington, CT (US)

( * ) Notice: Subject to any disclaimer, the term of this patent is extended or adjusted under 35 U.S.C. 154(b) by 786 days.

(21) Appl. No.: 16/355,893

(22) Filed: Mar. 18, 2019

(65) Prior Publication Data

US 2019/0211440 A1     Jul. 11, 2019

Related U.S. Application Data

(62) Division of application No. 15/109,884, filed on Jul. 6, 2016, now Pat. No. 10,233,533.

(51) Int. Cl.

| C23C 14/30 | (2006.01) |
| C23C 14/22 | (2006.01) |
| C23C 14/08 | (2006.01) |
| C23C 14/24 | (2006.01) |
| C23C 14/02 | (2006.01) |

(52) U.S. Cl.
CPC ............ *C23C 14/228* (2013.01); *C23C 14/02* (2013.01); *C23C 14/083* (2013.01); *C23C 14/24* (2013.01); *C23C 14/243* (2013.01); *C23C 14/30* (2013.01)

(58) Field of Classification Search
None
See application file for complete search history.

(56) References Cited

U.S. PATENT DOCUMENTS

| 3,639,151 A | * | 2/1972 | Krutenat | ................. | H01J 37/36 |
| | | | | | 427/566 |
| 3,889,019 A | | 6/1975 | Blecherman et al. | | |
| 4,926,439 A | | 5/1990 | Johnson et al. | | |

(Continued)

FOREIGN PATENT DOCUMENTS

| JP | 63232418 | 9/1988 |
| WO | 1992016672 | 10/1992 |
| WO | 2011140481 | 11/2011 |

OTHER PUBLICATIONS

The International Search Report and Written Opinion of PCT Application No. PCT/US2015/010394, dated Apr. 20, 2015.

(Continued)

*Primary Examiner* — David P Turocy
(74) *Attorney, Agent, or Firm* — Carlson, Gaskey & Olds, P.C.

(57) ABSTRACT

An apparatus for use in a coating process includes a chamber, a crucible configured to hold a coating material in the chamber, an energy source operable to heat the interior of the chamber, a coating envelope situated with respect to the crucible, and at least one gas manifold located near the coating envelope. The at least one gas manifold is configured to provide a gas screen between the coating envelope and the crucible.

8 Claims, 4 Drawing Sheets

(56) References Cited

U.S. PATENT DOCUMENTS

| | | | |
|---|---|---|---|
| 5,087,477 A * | 2/1992 | Giggins, Jr. | C23C 14/0021 427/126.3 |
| 5,997,947 A | 12/1999 | Burns et al. | |
| 7,718,222 B2 | 5/2010 | Hass et al. | |
| 7,838,083 B1 | 11/2010 | Youchison et al. | |
| 7,879,187 B2 | 2/2011 | Jeon | |
| 8,506,715 B2 | 8/2013 | Neal | |
| 8,541,069 B2 * | 9/2013 | Greenberg | C23C 14/228 427/595 |
| 2002/0152961 A1 | 10/2002 | Burns | |
| 2003/0180571 A1 | 9/2003 | Singh | |
| 2003/0203127 A1 | 10/2003 | Bruce et al. | |
| 2005/0000444 A1 * | 1/2005 | Hass | C23C 14/0021 118/723 EB |
| 2005/0029088 A1 * | 2/2005 | Delahoy | C23C 14/228 204/192.12 |
| 2008/0131611 A1 | 6/2008 | Hass et al. | |
| 2008/0220177 A1 | 9/2008 | Tass et al. | |
| 2009/0056625 A1 | 3/2009 | Loo et al. | |
| 2009/0123646 A1 | 5/2009 | Varetti | |
| 2010/0047474 A1 | 2/2010 | Neal | |
| 2010/0104766 A1 | 4/2010 | Neal | |
| 2011/0223353 A1 | 9/2011 | Neal et al. | |

OTHER PUBLICATIONS

European Search Report for European U.S. Appl. No. 15/735,044 completed Jun. 27, 2017.
International Preliminary Report on Patentability for PCT Application No. PCT/US2015/010394 dated Jul. 21, 2016.

* cited by examiner

APPARATUS FOR USE IN COATING PROCESS

CROSS-SECTION TO RELATED APPLICATION

This disclosure is a divisional of U.S. patent application Ser. No. 15/109,884 filed Jul. 6, 2016.

BACKGROUND

This disclosure relates to a coating process and equipment therefor.

Physical vapor deposition ("PVD") is one common method for depositing a coating, such as a metallic coating or a ceramic coating, on a substrate. One type of PVD process utilizes an electron beam gun to melt and evaporate a source coating material contained within a crucible. The evaporated source material condenses and deposits onto the substrate.

SUMMARY

An apparatus according to an example of the present disclosure, for use in a coating process, includes a chamber, a crucible configured to hold a coating material in the chamber, an energy source operable to heat the interior of the chamber, a coating envelope situated with respect to the crucible, and at least one gas manifold located near the coating envelope, the at least one gas manifold being configured to provide a gas screen between the coating envelope and the crucible.

In a further example of any of the examples herein, the coating envelope is within a hood within the chamber, the hood including a wall that extends partially around an interior region in which the coating envelope is located, and the at least one gas manifold is within the interior region of the hood adjacent the coating envelope.

In a further example of any of the examples herein, the at least one gas manifold includes first and second gas manifolds arranged on opposed sides of the coating envelope.

In a further example of any of the examples herein, the at least one gas manifold includes a hollow tube having a plurality of apertures arranged along a side thereof, the plurality of apertures being directed toward the coating envelope.

In a further example of any of the examples herein, the coating envelope and the at least one gas manifold are vertically above the crucible, and further comprising at least one additional gas manifold located below the crucible.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
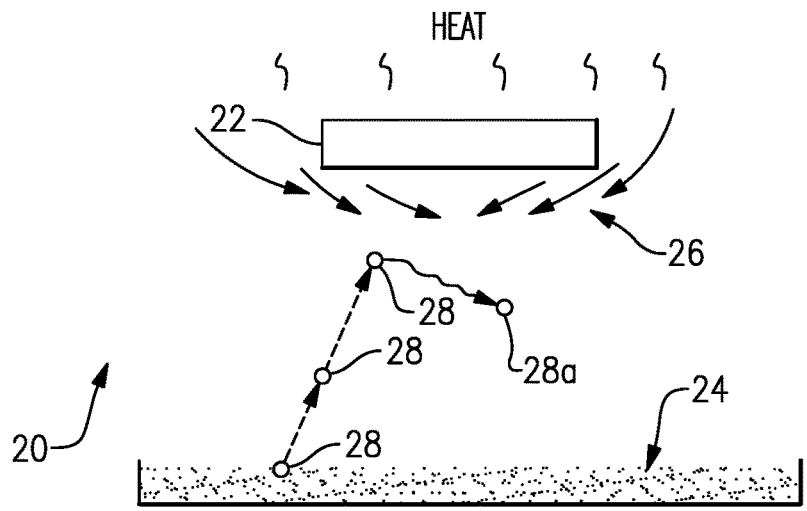
FIG. 1 illustrates an example method for use in a coating process.

FIG. 1 schematically illustrates an example method 20 for use in a coating process. For example, the method 20 can be used in an electron-beam physical vapor deposition process that is used to apply a coating to a substrate. The examples herein may be described with reference to the deposition of a ceramic coating onto a substrate, such as, but not limited to, gas turbine engine airfoils or airfoil multiplets of a plurality of airfoil vanes. It is to be understood, however, that the examples can also be applied to other coatings, other gas turbine engine components, and non-engine components, particularly where premature deposition of a coating during pre-heating may be problematic.

Physical vapor deposition involves the vaporization of a source coating material that then condenses onto a substrate. For some types of substrates, an oxide scale (e.g., aluminum oxide) is grown on the substrate from an aluminum-containing bond coat prior to and during the deposition, to ensure bonding of a deposited ceramic topcoat. The oxide scale can be grown in a pre-heating step prior to, and, more significantly, also during the deposition, in the same chamber that the deposition is conducted in. In this regard, the pre-heating can be conducted at an elevated temperature in an oxygen-containing environment to initiate and sustain oxide scale growth. An additional reason to conduct the pre-heating and coating deposition in the presence of oxygen is to maintain the chemical stoichiometry of the coating. There are also additional or different reasons for using a pre-heating step prior to depositing a coating. For example, the substrate is pre-heated to ensure that coating deposition is initiated and conducted at a suitable temperature that ensures adherence of the coating to the substrate after the completion of the coating process, as well as during subsequent thermal cycling of the coated part in a gas turbine engine.

The coating material, such as a ceramic material, is also present in the coating chamber during the pre-heating, in preparation for the subsequent deposition and so that the process can be conducted efficiently without necessarily having to move the substrate between different chambers. Although the coating material may be in solid form, the coating material can volatilize, such as by sublimation or by localized melting and vaporization, to vapor during the pre-heating and prematurely deposit onto the substrate. The premature deposition can alter the chemistry and microstructure of the thermally grown oxide and the coating, and can ultimately debit the performance of the component. As will be described herein, the method 20 facilitates the reduction of premature deposition.

Referring to FIG. 1, the method 20 includes pre-heating a substrate 22 in the presence of a coating material 24 that is volatile. The term "volatile" refers to the vaporization of the coating material 24 at the selected pre-heating conditions, or to the transformation of at least a portion of the coating material 24 to a state or size that can be readily transported to and deposited onto the substrate at the selected pre-heating conditions. During the pre-heating, or a substantial portion thereof, the volatile coating material 24 can be in solid form. In contrast, at least a substantial portion of the volatile coating material is in a molten state during the later deposition step. To isolate, or at least partially isolate, the substrate 22 from premature deposition of any volatilized coating material 24, the substrate 22 is shielded during the pre-heating by establishing a gas screen 26 between the substrate 22 and the coating material 24 through increased oxygen gas and/or other gas flow.

As shown in FIG. 1, a portion 28 of the coating material 24 has volatilized during the pre-heating. The volatilized coating material 28 may travel toward the substrate 22. However, before the volatilized coating material 28 can deposit onto the substrate 22, the gas screen 26 redirects the volatilized coating material 28, as represented at 28*a*, away from the substrate 22, thus avoiding deposition. The gas screen 26 thus serves to shield the substrate 22 from premature deposition of the volatile coating material 24.

In one example, the gas screen 26 is or includes a counter-flow of gas against the volatilized coating material 28. That is, the gas screen 26 includes one or more gas streams jetted in a direction or multiple directions that have directional components opposite to the direction of travel of the volatilized coating material 28 toward the substrate 22. In general, the counter-flow direction will be the direction from the substrate 22 toward the source or sources of the coating material 24.

The gas screen 26 is, however, not limited to counter-flow gas and can alternatively or additionally include sweep flow, gas pressure screening, or combinations thereof. In sweep flow, the gas screen 26 includes one or more gas streams jetted in a direction or multiple directions that have directional components aligned with a directional component of the direction of travel of the volatilized coating material, where the aligned directional components are pointed away from the substrate 22. For instance, the gas screen 26 could include a horizontal (in FIG. 1) stream or streams between the substrate 22 and the coating material 24 that intercept and carry away volatilized coating material 28 prior to deposition.

In a gas pressure screening, the gas screen 26 is provided as a gas flow from within a partially enclosed local volume around the substrate 22, with at least one open side of the partial local enclosure which is oriented toward the source of the coating material 24. The gas provided from within the partial local enclosure increases pressure within the partial local enclosure relative to the volume outside of the partial local enclosure, which results in a locally high pressure region around the substrate 22 and also at the mouth of the open side. The locally high pressure diverts volatilized coating material from entering the open side of the partial local enclosure and depositing on the substrate 22. In the example shown in FIGS. 2 and 4, the partial local enclosure is a thermal hood 52.

Figure 2:
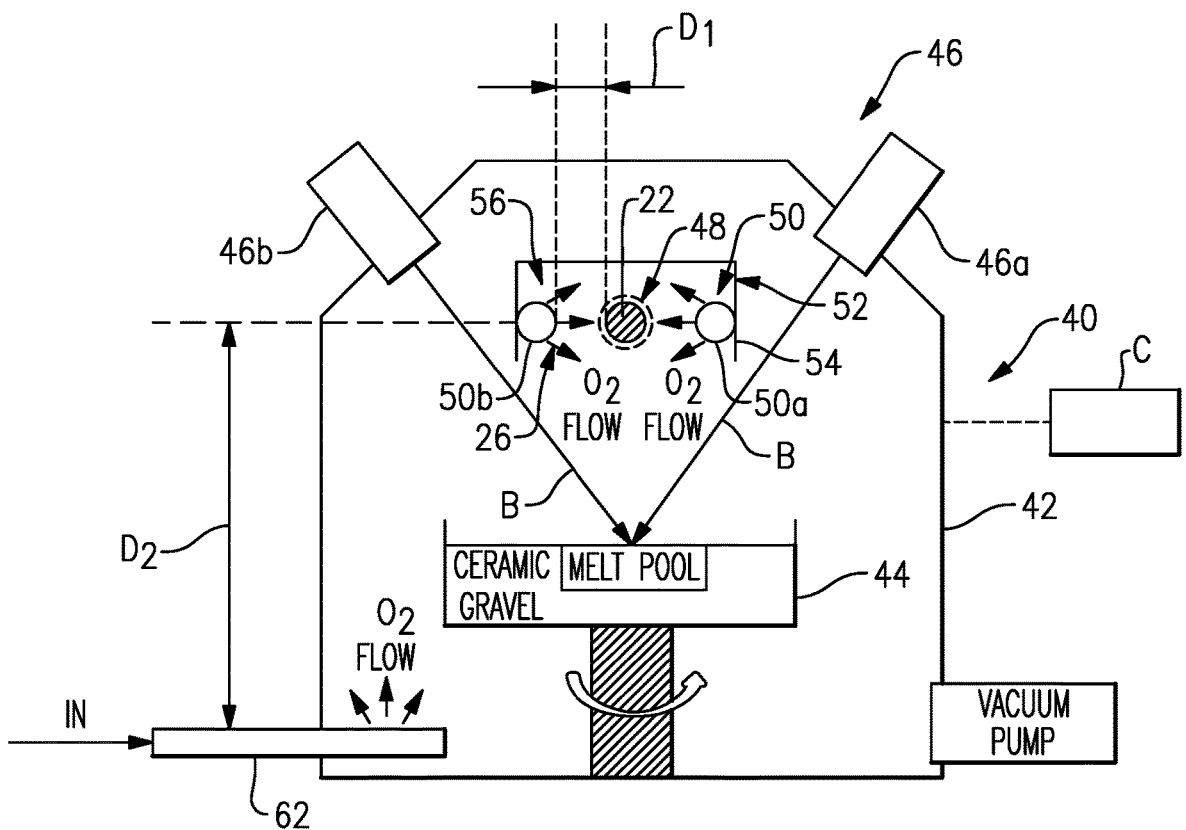
FIG. 2 illustrates an example apparatus for conducting the method

FIG. 2 illustrates an example apparatus 40 that is adapted for carrying out the method 20. The apparatus 40 includes a chamber 42 and a crucible 44 that is configured to hold a volatile coating material 24 in the chamber 42. For example, the crucible 44 can be a tray that holds particulate of the volatile coating material 24. Alternatively, the crucible 44 can be adapted to hold and present an ingot of the coating material 24.

The apparatus 40 further includes an energy source 46 that is operable to heat the interior of the chamber. In this example, the energy source 46 includes one or more electron beam guns 46*a* and 46*b* that are operable to emit electron beams, represented at B. The electron beams B can be scanned across the coating material 24, and/or other heating target, to produce heat in the interior of the chamber 42. Alternatively, in addition to the electron beam guns 46*a* and 46*b*, the apparatus 40 could have a separate or dedicated heater, such as a heating coil.

A coating envelope 48 is situated with respect to the crucible 44. The coating envelope 48 is the region in which the substrate 22 is positioned in the chamber 42 to apply the coating. The coating envelope 48 thus represents a spatial volume where the substrate 22 (or substrates 22 if more than one is coated at a time) is located, including spatial volumes that the substrate 22 passes through, if rotated during coating.

At least one gas manifold 50 is located near the coating envelope 48. The gas manifold 50 is configured to provide the gas screen 26 between the coating envelope 48 and the volatile coating material 24 in the crucible 44.

In this example, the chamber 42 includes a thermal hood 52, which can also be referred to as a coater box. The hood 52 includes a wall 54 that extends partially around an interior region 56 in which the coating envelope 48 is located. The gas manifold or manifolds 50 are also located within the interior region 56, adjacent the coating envelope 48.

Figure 3:
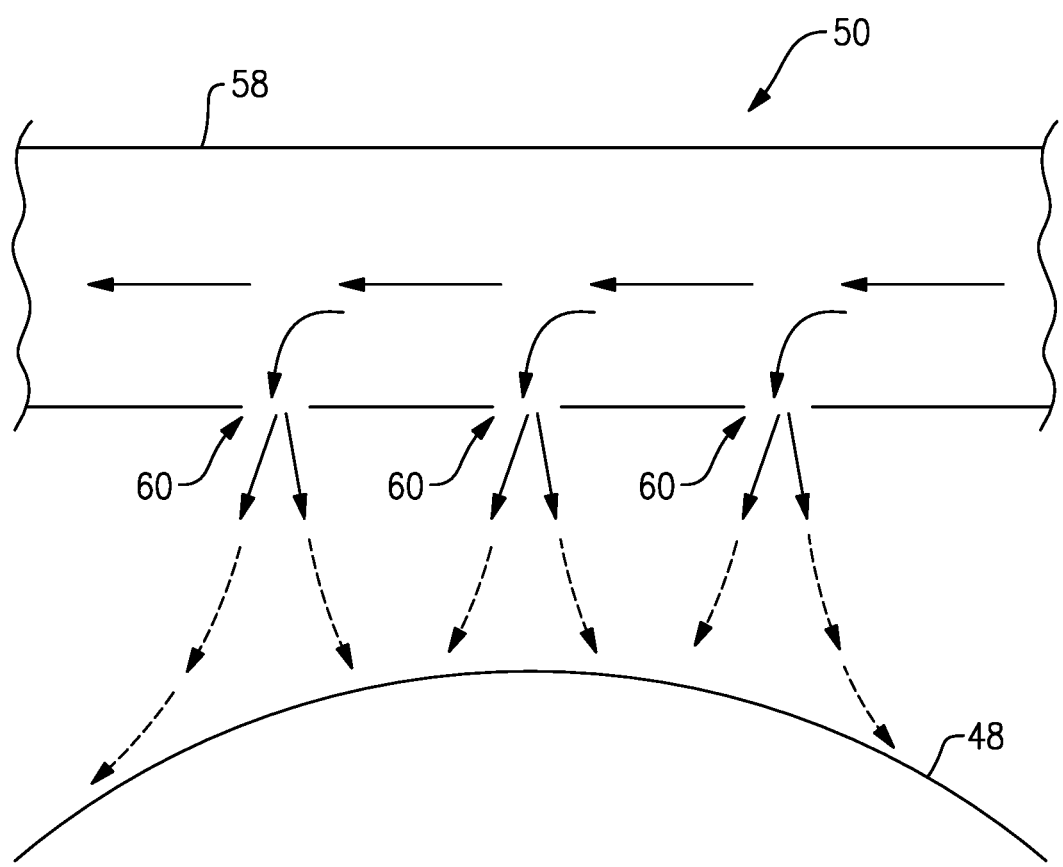
FIG. 3 illustrates an example gas manifold for establishing a gas screen in a coating process.

In this example, the gas manifold 50 includes first and second gas manifolds 50*a*/50*b* arranged, respectively, on opposed sides of the coating envelope 48. A single manifold manifold or additional manifolds as a set can alternatively be used to control the gas screen 26 as desired. An example of a representative gas manifold 50 is shown in FIG. 3. The gas manifold 50 includes a hollow tube 58 having a plurality of apertures 60 that are arranged along a side of the hollow tube 58. The apertures 60 are directed toward the coating envelope 48. The apertures 60 can be arranged circumferentially or peripherally around the tube 58 and axially along the length of the tube 58 in order to provide the gas screen 26, which in this example can fully or substantially fully envelop the coating envelope 48 to shield all sides of the substrate 22.

Referring again to FIG. 2, the apparatus 40 also includes at least one gas manifold 62 near the bottom of the chamber 42. A single gas manifold 62 or additional manifolds 62 as a set can alternatively be used. The gas manifold 50 and the coating envelope 48 are located vertically above the crucible 44 and the gas manifold or manifolds 62 is/are located below the crucible 44. Each of the gas manifolds 50 and 62 can be connected to one or more gas sources, such as an oxygen-containing gas, which can be pure or substantially pure oxygen. In addition, the gas manifolds 62 can be connected to other gas sources such as He, Ne, Ar, Kr, Xe or their mixtures. The gas manifolds 50 and 62, or the lines connecting these to the gas source or sources, can also include one or more metering valves to control the gas flow into the chamber 42. In this regard, the apparatus 40 can further include or be connected with a controller, represented at C. The controller C can be operably connected with any or all of the components of the apparatus 40 to control the operation thereof. This includes, but is not limited to, any valves, mechanisms to move or rotate the crucible and/or substrate 22, the electron beam guns 46*a*/46*b*, a vacuum pump, and any other components related to the operation of the apparatus 40. In this regard, the controller can include hardware, such as a microprocessor, software, or a combination thereof, that is configured to carry out any or all of the method steps and functions disclosed herein.

Figure 4:
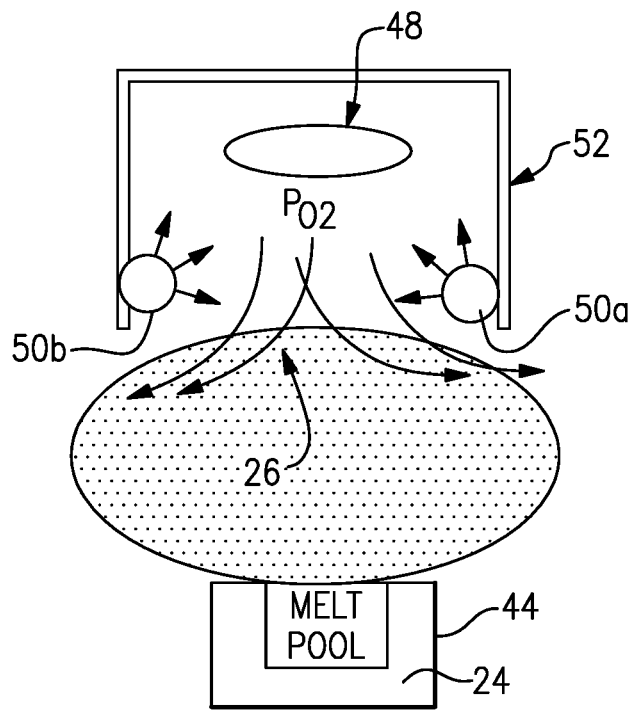
FIG. 4 illustrates a portion within the chamber of the apparatus of FIG. 2 during pre-heating.

The apparatus 40 can be used to apply a ceramic coating to the substrate 22, such as a gas turbine engine component, by electron-beam physical vapor deposition. The coating material 24 can be any ceramic material that is desired to be deposited onto the substrate 22. For example, the ceramic material can be a zirconium-containing material, such as yttria-stabilized zirconia (YSZ), gadolinia-stabilized zirconia (GSZ), or combinations thereof. In particular, the gadolinium-oxide present in GSZ has a relatively high vapor pressure and can readily volatilize and prematurely deposit at temperatures and conditions that are used for pre-heating gas turbine engine components to form oxide scales. The pre-heating temperature can be 1750-2100° F. (954-1149° C.), but may vary depending on the chemistry of the substrate or the aluminum-containing bond coat and type of oxide to be grown, for example. Such pre-heating steps can be conducted at sub-ambient pressures provided by a vacuum pump. The gas screen 26 provided by the gas manifold or manifolds 50 shields the substrate 22 from premature deposition, as also shown in FIG. 4.

In a further example, the pre-heating is conducted in an oxygen-containing environment at a sub-ambient pressure within the chamber 42, in order to grow the oxide scale on the substrate 22. In this regard, if an oxygen-containing gas is used for the gas screen 26, the gas screen 26 can serve a dual purpose of shielding the substrate 22 and locally providing oxygen for the growth of the oxide scale or maintaining the chemical stoichiometry of the coating during the deposition stage.

The gas screen 26 has a shielding strength related to its rate of gas flow. For example, higher rates of gas flow from the gas manifold 50 have a greater ability to redirect any volatilized coating material 24 away from the substrate 22 to provide a "higher strength" gas screen 26, and vice versa. Thus, the strength of the gas screen 26 can be adjusted through adjustment of gas flow rate to the manifold 50. In non-limiting examples, the gas flow rate can be greater than 500 standard cubic centimeters per minute (sccm), greater than 750 sccm, or even greater than 1000 sccm. The gas flow rate can thus be adjusted in accordance with a desired shielding strength, which may correspond to flow velocity around the substrate 22, flow velocity in the counter-flow direction, flow velocity transverse to the deposition direction, gas pressure screening pressurization, or combinations thereof. Additionally, higher molecular weight gas or a gas mixture with higher average molecular weight can also increase the strength of the gas screen 26.

Upon conclusion of the pre-heating, once a desired temperature of substrate 22 is reached, the shielding strength of the gas screen 26 can be reduced in preparation for controlled coating deposition. For instance, the shielding strength can be reduced to a non-zero flow rate or can be completely terminated such that there is no gas flow from the manifold 50. At least a small amount of gas flow may be desired to prevent deposition over the apertures 60.

Figure 6:
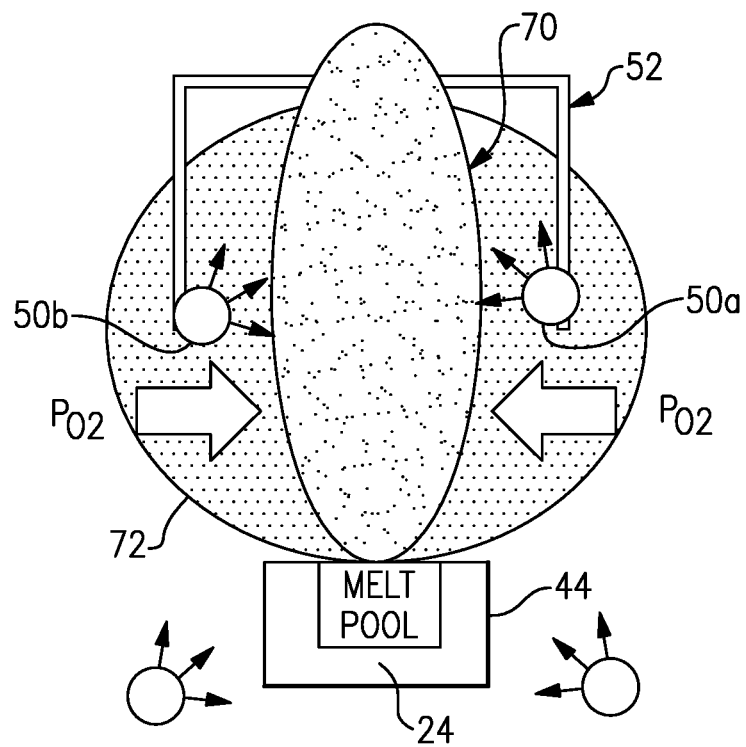
FIGS. 5 and 6 illustrate a portion within the chamber of the apparatus of FIG. 2 during coating deposition, wherein a supplied gas creates a back-pressure that collimates a coating stream or plume of volatilized coating material.
Figure 5:
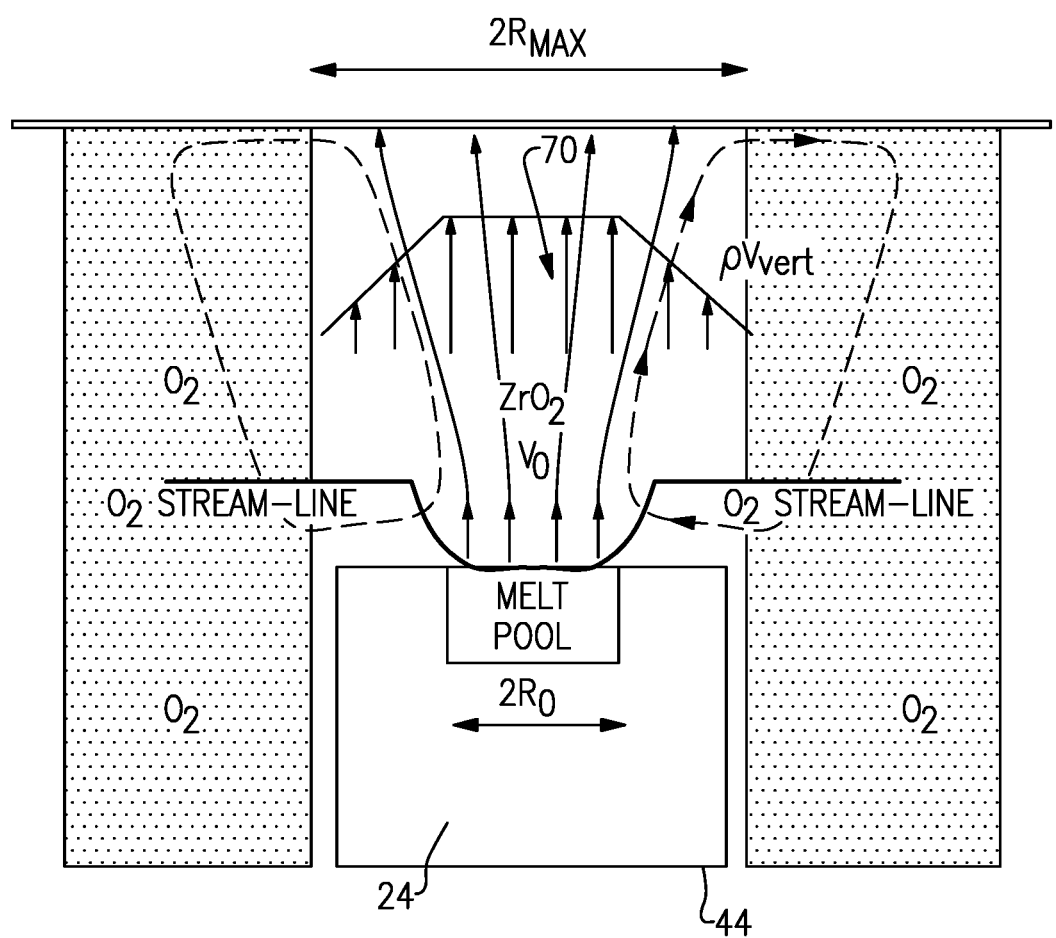

Upon reduction in the shielding strength, the ceramic coating can then be deposited in a controlled manner onto the substrate 22 by melting and volatilizing the coating material 24 to form a coating vapor or plume using the electron beam guns 46a/46b. In this regard, the manifold or manifolds 62 can be activated to provide a gas flow and additional gas pressure within the chamber 42. The gas flowing through the manifold or manifolds 62 can be oxygen, or helium or Ne or Ar, Kr or Xe or the mixture of thereof. For example, the gas is an oxygen-containing gas supplied to the chamber 42. Referring to FIGS. 4-6 showing a portion within the chamber 42 during coating deposition in which the shielding strength has been reduced, the gas from the manifold or manifolds 62 creates an additional pressure (back-pressure) in the vacuum chamber 42 and compresses/collimates the stream or plume, represented at 70, of volatilized coating material. The back-pressure does not change the evaporation rate of the coating material 24 but the compression/collimation of the plume 70 effectively increases the plume density. This in turn results in an increase in deposition rate by "focusing" the plume 70 at the substrate 22 and coating envelope 48. As a comparison, a broader, less dense plume would be produced without such back-pressure. The approximate relationship between the melt pool size $2R_0$, gas back-pressure, $P_{out}$, saturated vapor pressure of vaporized ceramics, $P_S$, and the resulting effective size of the plume 70 of volatilized coating material plume $2R_{max}$ is $$\frac{R_{max}}{R_0} = \left(\frac{P_S}{P_{out}}\right)^{\frac{1}{2\gamma}}$$

where $\gamma \sim c_p/c_v \sim 1.33$. Varying the oxygen flow from the manifolds 50 can produce turbulence needed to promote deposition on surfaces that are normally difficult to coat, such as surfaces that are "shadowed" by other portions of the substrate 22 (surfaces out of the line-of-sight to the melt pool in crucible 44). There is an optimum oxygen flow rate that is between the minimum flow rate needed to support stoichiometry of the coating and the maximum flow rate which suppresses the coating deposition. Thus, the manifold 50 near the coating envelope 48 initially (during pre-heating) provides a gas flow for establishing the gas screen 26 to protect from premature deposition, and during the coating process provides oxygen supply to keep desired stoichiometry of the coating. The manifold 62 provides additional back-pressure in the chamber 42 and does not participate in providing desired coating chemical composition. Thus any appropriate/non-reactive gas can be used to regulate the shape of the vapor plume 70. The pressures (pressure ratios) of manifolds 50 and 62 can be adjusted to attain a desired coating speed and desired coating composition. Additional parameters can be controlled to further facilitate deposition on surfaces that are out of the line-of-sight, such as but not limited to using a relatively high pressure environment for the deposition step. In any of the examples herein, the pressure during deposition can be $5 \times 10^{-4}$ torr to $3 \times 10^{-1}$ torr, and at least a portion of the pre-heating step can also be carried out in this same pressure range.

In a further example, the relative distance between the manifold 50 and the coating envelope 48 and between the manifold 62 and the coating envelope 48 is controlled in order to ensure proper formations of the gas screen 26. For example, the minimum distance between the coating envelope 48 and the manifold 50 is represented at $D_1$ and the vertical distance between the manifold 62 and the coating envelope 48 is represented at $D_2$. In one example, $D_2$ is at least two times greater than $D_1$. In a further example, $D_2$ is at least eight times greater than $D_1$.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. An apparatus for use in a coating process, comprising:
a chamber;
a crucible configured to hold a coating material in the chamber;
a coating envelope situated with respect to the crucible;
an energy source operable to heat the interior of the chamber and to evaporate the coating material during a coating process such that volatilized coating material travels in a coating direction from the crucible to toward the coating envelope; and
at least one gas manifold located near the coating envelope, the at least one gas manifold being configured to provide a gas screen between the coating envelope and the crucible, the at least one gas manifold including a hollow tube and apertures in the hollow tube that are arranged circumferentially around the hollow tube and axially along the length of the hollow tube, and at least one of the apertures is aimed in a direction having a directional component opposite to the coating direction.

2. The apparatus as recited in claim 1, wherein the coating envelope is within a hood within the chamber, the hood including a wall that extends partially around an interior region in which the coating envelope is located, and the at least one gas manifold is within the interior region of the hood adjacent the coating envelope.

3. The apparatus as recited in claim 2, wherein the at least one gas manifold includes first and second gas manifolds arranged on opposed sides of the coating envelope.

4. The apparatus as recited in claim 1, wherein the at least one other one of the apertures is directed toward the coating envelope.

5. The apparatus as recited in claim 1, wherein the coating envelope and the at least one gas manifold are vertically above the crucible, and further comprising at least one additional gas manifold located below the crucible.

6. The apparatus as recited in claim 1, wherein the energy source includes an electron beam gun.

7. The apparatus as recited in claim 1, wherein at least one other one of the apertures is aimed in a direction having a directional component away from the crucible.

8. The apparatus as recited in claim 1, wherein the at least one gas manifold is connected with a gas source of an oxygen-containing gas.

* * * * *